US011243476B2

United States Patent
Van Dorst et al.

(10) Patent No.: US 11,243,476 B2
(45) Date of Patent: Feb. 8, 2022

(54) STAGE APPARATUS, LITHOGRAPHIC APPARATUS, CONTROL UNIT AND METHOD

(71) Applicant: ASML Netherlands B.V., Veldhoven (NL)

(72) Inventors: Ringo Petrus Cornelis Van Dorst, Boxtel (NL); Gijs Kramer, Nijmegen (NL); Benjamin Cunnegonda Henricus Smeets, Weert (NL); Mark Johannes Hermanus Frencken, Ittervoort (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/050,149

(22) PCT Filed: Mar. 27, 2019

(86) PCT No.: PCT/EP2019/057672
§ 371 (c)(1),
(2) Date: Oct. 23, 2020

(87) PCT Pub. No.: WO2019/206548
PCT Pub. Date: Oct. 31, 2019

(65) Prior Publication Data
US 2021/0116820 A1    Apr. 22, 2021

(30) Foreign Application Priority Data

Apr. 26, 2018 (EP) .................................... 18169639
Jan. 8, 2019 (EP) .................................... 19150671

(51) Int. Cl.
*G03F 7/20* (2006.01)
*H01L 21/67* (2006.01)

(52) U.S. Cl.
CPC ........ *G03F 7/70725* (2013.01); *G03F 7/7085* (2013.01); *G03F 7/70716* (2013.01);
(Continued)

(58) Field of Classification Search
CPC ............. G03F 7/70725; G03F 7/70775; G03F 7/70783; G03F 7/7085; G03F 7/70716;
(Continued)

(56) References Cited

U.S. PATENT DOCUMENTS 4,522,489 A    6/1985 Bouwer
5,563,684 A    10/1996 Stagaman
(Continued)

FOREIGN PATENT DOCUMENTS

EP    3 385 792 A2    10/2018
JP    H07-74088 A    3/1995
(Continued)

OTHER PUBLICATIONS

English translation of JP2014-003259, published Jan. 9, 2014. (Year: 2014).*

(Continued)

*Primary Examiner* — Christina A Riddle
(74) *Attorney, Agent, or Firm* — Sterne, Kessler, Goldstein & Fox P.L.L.C.

(57) ABSTRACT

The invention provides a stage apparatus comprising an object support, a plurality of support members, a gripper and a control unit. The object support comprises a surface for mounting an object on, the surface extending in a plane. The plurality of support members are for supporting the object, and are arranged to receive the object from a gripper and to arrange the object on the surface and/or vice versa. The support members are moveable in at least a first direction which is perpendicular to the plane. The control unit is arranged to receive shape information regarding an out-of- (Continued)

plane-shape of the object, and is arranged to control positions of the support members. The control unit is arranged to tilt the object while supported by the support members by controlling the positions so as to reduce a space consumption of the object in the first direction, based on the shape information.

20 Claims, 9 Drawing Sheets

(52) U.S. Cl.
CPC ...... *G03F 7/70733* (2013.01); *G03F 7/70775* (2013.01); *G03F 7/70783* (2013.01); *H01L 21/67259* (2013.01); *H01L 21/67288* (2013.01)

(58) Field of Classification Search
CPC .. G03F 7/703; G03F 7/70608; G03F 7/70616; G03F 7/70675; G03F 7/70691; G03F 7/707; G03F 7/70708; G03F 7/70733–7075; G03F 7/70758; G03F 7/70791; G03F 7/708; G03F 7/70808; G03F 7/70816; G03F 7/70825; G03F 7/70841; G03F 7/79; G03F 7/70908; G03F 7/70975; G03F 7/70991; H01L 21/67259; H01L 21/67288; H01L 21/68742; H01L 21/67092; H01L 21/68–683; H01L 21/6835; H01L 21/6838; H01L 21/687–68714; H01L 21/68728; H01L 21/68735; H01L 21/6875; H01L 21/68764; H01L 21/68778; H01L 21/68785; H01L 21/68792; H01L 22/12
USPC ...... 250/492.1–492.3, 493.1, 504 R; 355/30, 355/39, 47–49, 52–77; 430/5, 8, 22, 30, 430/269; 414/589–590, 754, 755, 414/778–779, 784, 936–941
See application file for complete search history.

(56) References Cited

U.S. PATENT DOCUMENTS

| | | | |
|---|---|---|---|
| 5,564,682 A * | 10/1996 | Tsuji | B25B 11/005 269/21 |
| 6,020,964 A | 2/2000 | Loopstra et al. | |
| 6,952,253 B2 | 10/2005 | Lof et al. | |
| 2002/0044864 A1* | 4/2002 | Hyakudomi | H01L 21/6875 414/784 |
| 2005/0028740 A1 | 2/2005 | Okuda | |
| 2005/0263077 A1 | 12/2005 | GanapathiSubramanian et al. | |
| 2007/0058173 A1 | 3/2007 | Holzapfel | |
| 2011/0236162 A1* | 9/2011 | Shikayama | H01L 21/68742 414/222.01 |
| 2013/0222782 A1 | 8/2013 | Kasa et al. | |
| 2015/0228521 A1 | 8/2015 | Wimplinger et al. | |
| 2016/0370712 A1* | 12/2016 | Shibazaki | G03F 7/707 |

FOREIGN PATENT DOCUMENTS

| | | |
|---|---|---|
| JP | 2004-228453 A | 8/2004 |
| JP | 2007-189181 A | 7/2007 |
| JP | 2009-010085 A | 1/2009 |
| JP | 2010-034208 A | 2/2010 |
| JP | 2010-056217 A | 3/2010 |
| JP | 2011-091070 A | 5/2011 |
| JP | 2013-161946 A | 8/2013 |
| JP | 2014-003259 A | 1/2014 |
| JP | 2015-050418 A | 3/2015 |
| JP | 2015-099927 A | 5/2015 |
| WO | WO 2015/169616 A1 | 11/2015 |

OTHER PUBLICATIONS

International Search Report and Written Opinion of the International Searching Authority directed to related International Patent Application No. PCT/EP2019/057672, dated Jul. 11, 2019; 8 pages.
International Preliminary Report on Patentability directed to International Patent Application No. PCT/EP2019/057672, dated Oct. 27, 2020; 6 pages.

* cited by examiner

STAGE APPARATUS, LITHOGRAPHIC APPARATUS, CONTROL UNIT AND METHOD

CROSS REFERENCE TO RELATED APPLICATIONS

This application claims priority of EP applications 18169639.4 which was filed on 2018 Apr. 26 and 19150671.6 which was filed on 2019 Jan. 8 and which are incorporated herein in their entirety by reference.

FIELD

The present invention relates to the technical field of lithography.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

While the pattern is being projected on the substrate, the substrate is typically mounted on a substrate support. To arrange the substrate on the substrate support a plurality of support pins are arranged to receive the substrate. After receiving the substrate the support pins are simultaneously moved vertically downwards until the substrate is supported by the substrate support.

The available space in vertical direction above the substrate support is very limited. In recent years the substrates more often are not flat but have an out-of-plane shape, e.g. warped or bended. This may lead to physical contact between the substrate and other components which is undesired as it can lead to errors and interruptions in the process, resulting in reduced yield.

Furthermore as a consequence of the out-of-plane shape lower arranged parts of the substrate engage the substrate support before higher parts of the substrate. Clamping of the substrate on the substrate support leads to a higher and/or unknown stress distribution in the substrate after clamping.

US 2013/0222782 A1 proposes a substrate holding apparatus having multiple sets of support units which can be used for different shapes of substrates to reduce distortions in the substrate.

SUMMARY

It is an object of the invention to mitigate at least one of the disadvantages above, or at least provide an alternative stage apparatus.

This object is achieved with stage apparatus, comprising an object support, a plurality of support members and a control unit. The object support comprises a surface for mounting an object on. The surface extends in a plane. The plurality of support members are for supporting the object, and are arranged to receive the object from a gripper and to arrange the object on the surface and/or vice versa. The support members are moveable in at least a first direction which is perpendicular to the plane. The control unit is arranged to receive shape information regarding an out-of-plane-shape of the object, and is arranged to control positions of the support members. The control unit is arranged to tilt the object while supported by the support members by controlling the positions so as to reduce a space consumption of the object in the first direction, based on the shape information.

In the stage apparatus according to the invention, the position of the support members in the first direction is controlled based the out-of-plane shape of the object. Said out-of-plane shape is thus taken into account and the issues which follow from conventional apparatuses relating to contact between the object and other components are thereby at least reduced.

In an embodiment the control unit is arranged to determine a center of the object during or after tilting the object and to move the center to a desired position, wherein the center of the object is within the space consumption of the object in the first direction. By positioning the center of the object to a desired position, the risk of contact between the object and other components is reduced.

In an embodiment, the center of the object is halfway a most top part of the object and a most bottom part of the object along the first direction. The risk of contact between the object and other components is even further reduced.

In an embodiment, the stage apparatus comprises the gripper and a body arranged above the object, wherein, when the object is supported by the supporting members and the gripper is below the object, the control unit is configured the control the positions such that a lower distance between the object and the gripper and an upper distance between the object and the body grating are substantially equal to each other. By moving the object such that the lower distance and the upper distance are equal to each other, the risk of contact between the object and other components is even further reduced.

In an embodiment the body is one of an encoder grating and an encoder head. Encoder heads and encoder gratings are sensitive components. By reducing the risk of contact between the object and an encoder head or encoder grating, the robustness of the stage apparatus is increased.

In an embodiment the stage apparatus comprises three support members. By using three support members, the object can be tilted without significantly introducing more stress to the object.

In an embodiment the control unit is arranged to tilt the object so as to reduce the space consumption of the object in the first direction by setting the support members in a mounting arrangement in which the support members have a relative position relative to each other in the first direction, wherein the control unit is configured to maintain the mounting arrangement while loading the object on the surface. By maintaining the mounting arrangement, the object is as parallel as possible to the surface when coming into contact with the surface. As a result, the object is mounted on the surface with less deformation and/or stress.

In an embodiment the object support comprises a plurality of suction zones arranged to provide a suction force for clamping the object to the surface, wherein the control unit is configured to determine a suction force sequence based on the shape information, and wherein the control unit is configured to control the suction zones to provide the suction forces according to the suction force sequence during mounting of the object on the surface. By controlling the suction zones, the stress with which the object is mounted on the surface can be reduced.

In an embodiment the control unit further is configured to determine the suction force suctions based on the mounting arrangement.

In an embodiment the stage apparatus further comprises a positioner comprising a short-stroke module and a long-stroke module, wherein the short-stroke module comprises the object support and the long-stroke module comprises the plurality of support members. Advantageously, the short-stroke module does not comprise additional components which release thermal energy or form thermal and/or electrical leaks.

In an embodiment at least one of the support members comprises a tilting section configured to tilt an upper part of the at least one support member around an axis parallel to the plane. This way, the support member can maintain a good contact with the object while tilting the object relative to the plane to provide optimal support of the object.

In an embodiment the stage apparatus further comprises a common actuator configured to move the plurality of support members simultaneously in the first direction. The common actuator may e.g., be used for relatively large movement and/or to move the plurality of support members simultaneously.

In an embodiment, there is provided a lithographic apparatus comprising a projection system for projecting the pattern onto a substrate, the stage apparatus mentioned above; and a gripper configured to arrange the object above the object support, wherein the plurality of support members are arranged to receive the object from the gripper and arrange the object on the surface of the object support.

In an embodiment there is provided a control unit arranged for use in a stage apparatus mentioned above.

In an embodiment there is provided a method for loading an object onto a surface, wherein the surface extends in a plane, the method comprising: supporting the object on a plurality of support members; acquiring shape information regarding an out-of-plane-shape of the object; tilting, based on the shape information, the object by moving the plurality of support members in at least a first direction perpendicular to the surface, so as to reduce a space consumption of the object in the first direction.

BRIEF DESCRIPTION OF THE DRAWINGS

Embodiments of the invention will now be described, by way of example only, with reference to the accompanying schematic drawings wherein like reference numerals indicate like features, in which:

FIG. 5b illustrates a simplified top view of the warped object supported by the support members of the stage apparatus in the situation shown in FIG. 5a;

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
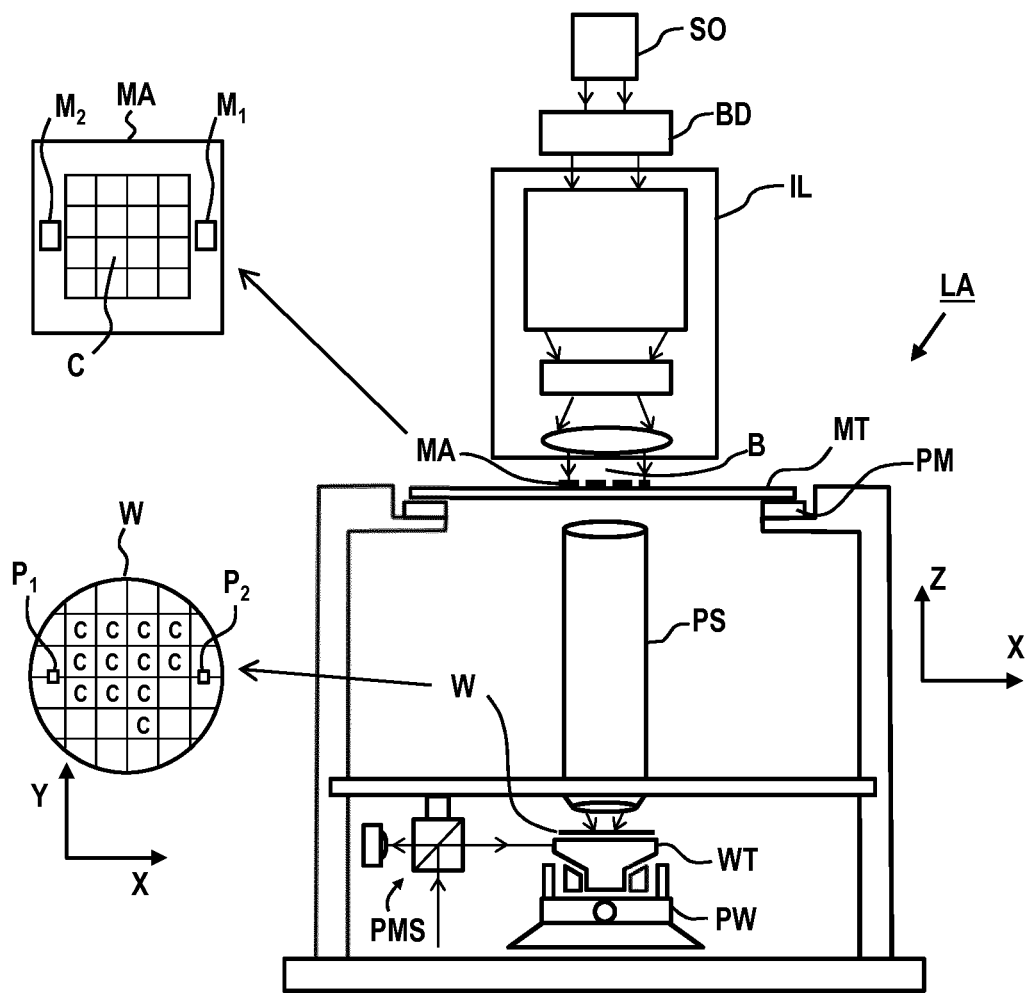
FIG. 1 depicts a schematic overview of a lithographic apparatus.

FIG. 1 schematically depicts a lithographic apparatus LA which may e.g. be embodied according to the invention. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W. The substrate support WT may e.g. be part of a stage apparatus according to the invention.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
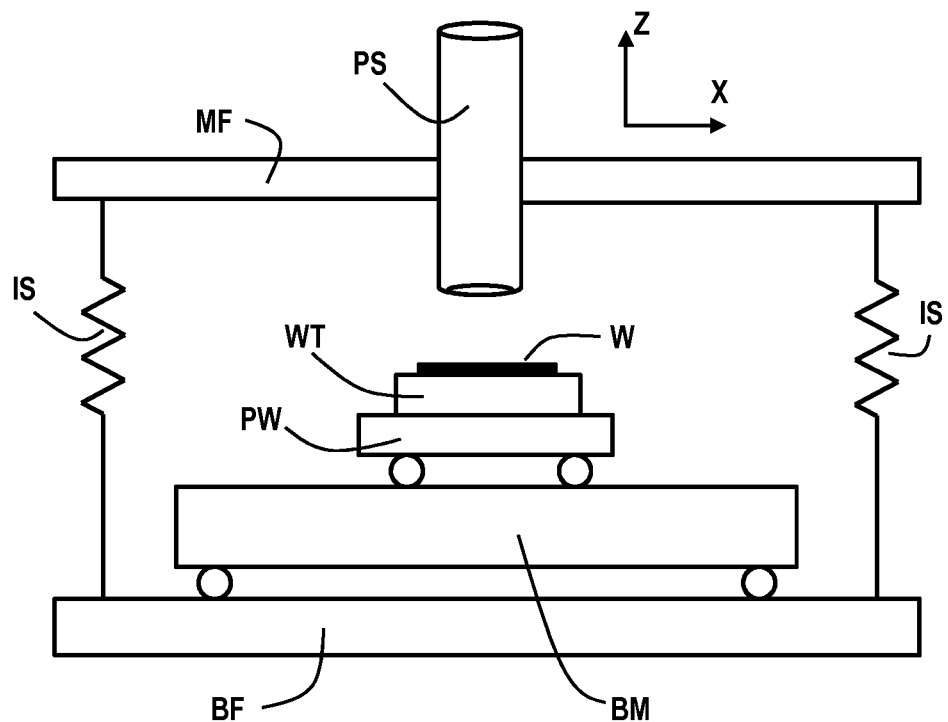
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor. a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads are arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electro-magnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
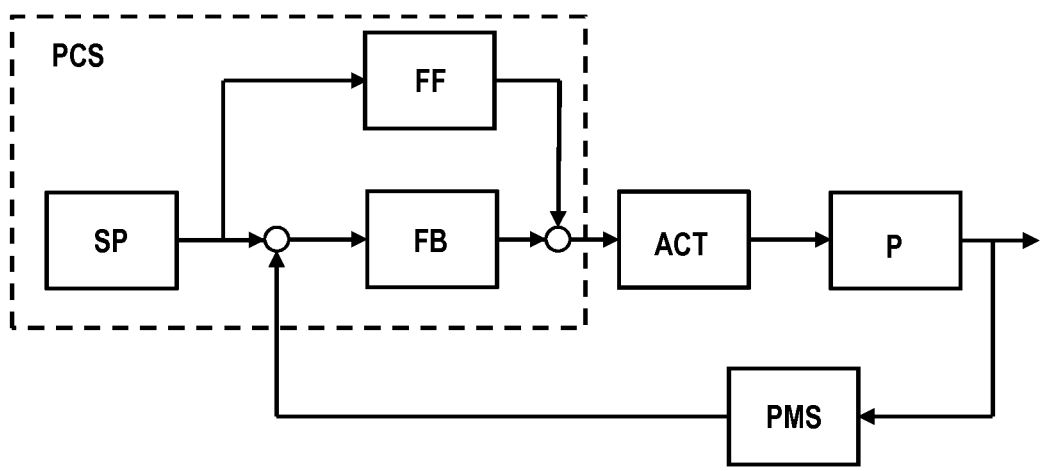
FIG. 3 schematically depicts a position control system.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

Figure 4A:
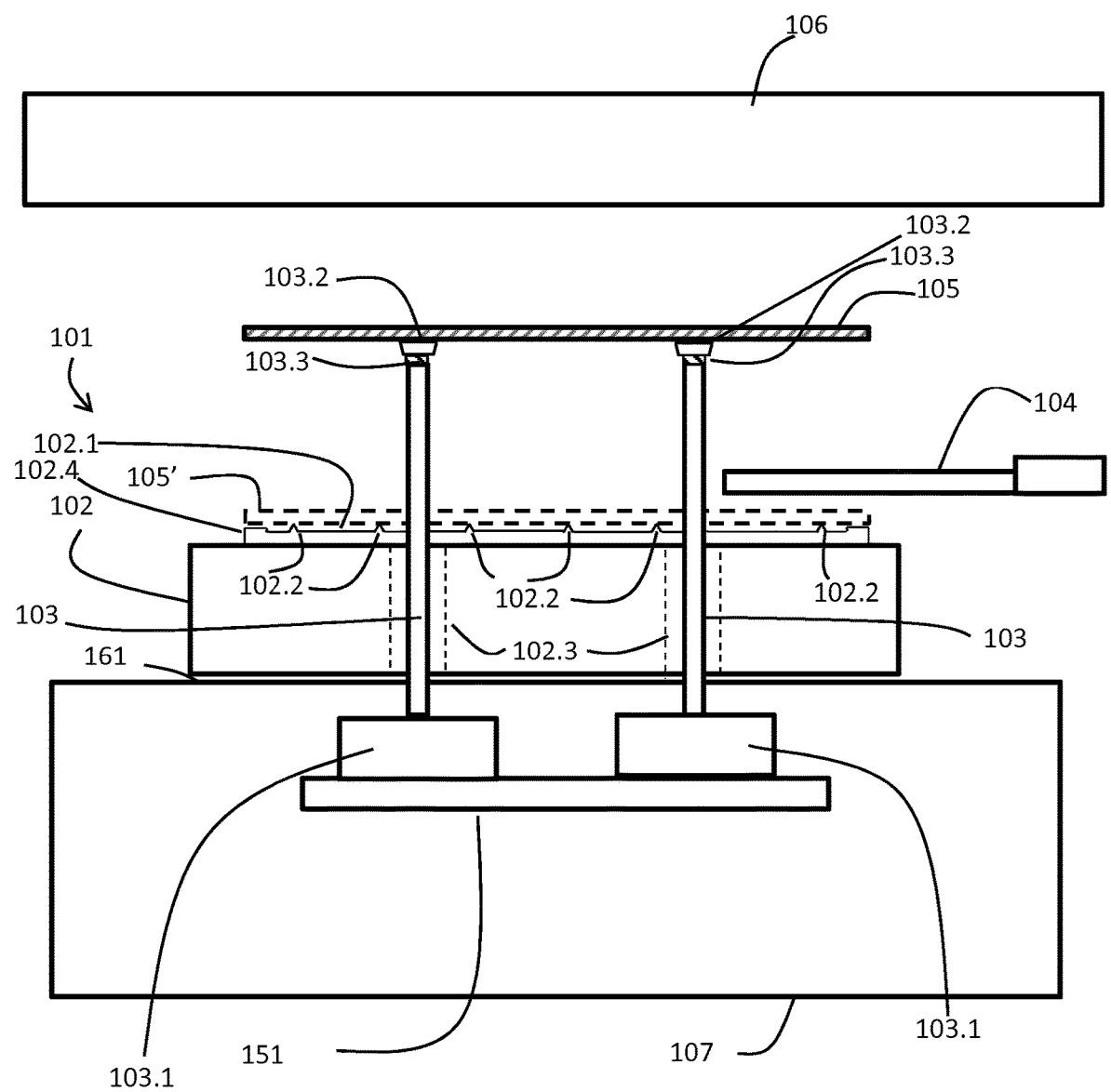
FIG. 4a depicts a side view of a stage apparatus according to the invention.

FIG. 4a shows a side view of a stage apparatus 101 according to the invention which comprises an object support 102 comprising a surface 102.1 for mounting an object 105 on, which e.g. is a substrate W. In the embodiment as shown, the surface 102.1 comprises a plurality of protrusions 102.2, also referred to as burls, onto which the object 105 can be supported. The surface 102.1 as shown substantially extends in a plane xy. The stage apparatus 101 further comprises a plurality of support members 103 for supporting the object 105, arranged to receive the object 105 from a gripper 104 and to arrange the object 105 on the surface 102.1 and/or vice versa. The support members 103 are moveable in at least a first direction z which is perpendicular to the plane xy.

Figure 4B:
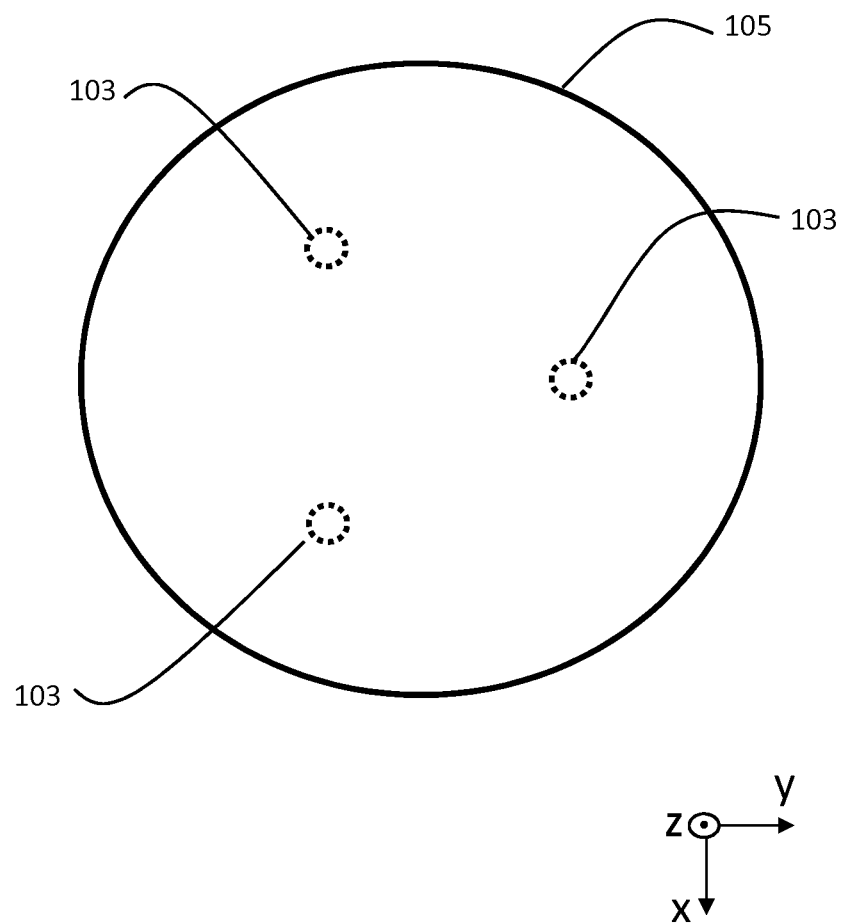
FIG. 4b illustrates a simplified top view of the object supported by the support members of the stage apparatus.

In the shown embodiment the stage apparatus 101 comprises three support members 103 of which two are visible in the side view shown in FIG. 4a. FIG. 4b shows a simplified top view of the object 105 illustrating how the support members 103 support the object 105. The three support members 103 are preferably arranged such that when seen in top view an imaginary equilateral triangle can be drawn wherein the support members 103 are situated on the angles. It is noted however that any suitable number of support members 103 may be applied in any suitable arrangement. Having three support members 103 has the advance that the object 105 can be properly supported without introducing much undesired stress in the object 105. Also, because the support members 103 move through the surface 102.1, the surface 102.1 needs to have openings to accommodate the support members 103. These openings provide less support to the object 105 than the rest of the surface 102.1, when the object 105 is supported by the surface 102.1. So the fewer openings in the surface 102.1, the better. Three support members 103 allows tilt of the object 105 along both the x-axis and y-axis. As is further visible in FIG. 4b, the object 105 in the shown embodiment has an optional disk shape with a circular shape when seen in the top view. The object 105 may have any other suitable shape. For example, the top view of the object 105 may a polygon, such as rectangular or square.

Referring now back to FIG. 4a; arranging the object 105 on the surface 102.1 can e.g. be accomplished as follows. In the situation shown in FIG. 4a the object 105 is supported by the support members 103 and the gripper 104 has been partially retracted. Prior to this situation the object 105 was supported by the gripper 104, which arranged the object 105 above the object support 102 to provide the object 105 to the stage apparatus 101. The gripper 104 may e.g. be driven by a robot, e.g. a multi-axis robot arm, which is part of a handling system that provides the object 105. The support members 103 are then moved vertically upwards from a retracted position wherein they are arranged below the surface 102.1 to a supporting position shown in FIG. 4a. During said vertically upwards movement the support members 103 engage the object 105. Once the object 105 is supported by the support members 103 the gripper 104 can be retracted to correspond with the situation shown in FIG. 4a. The support members 103 are arranged on the same height in the first direction z such that the object 105 is arranged horizontally. The support members 103 are then moved vertically downwards until the object 105 is arranged on the surface 102.1, as indicated by the dashed lines 105'. By moving vertically downward, the support members 103 are loading the object 105 onto the surface 102.1. In the shown embodiment the object support 102 further comprises an optional seal 102.4, e.g. a rim shaped structure surrounding the object support 102.

The object 105 can be removed in a similar manner, e.g. after the pattern has been projected on the object 105. While the object 105 is arranged on the surface 102.1 the support members 103 are in the retracted position below the surface 102.1 The support members 103 can be moved vertically upwards in the first direction z until they engage the object 105, such that the object 105 is supported by the support members 103 instead of the object support 102. The support members 103 can then be further moved vertically upwards in the first direction z until they reach the supporting position as shown in FIG. 4a again. The gripper 104 can then be moved below the object 105 to support the object 105. For example, the gripper 104 can be moved vertically upwards after being arranged under the object 105 in order the engage the object 105. It is also possible to move the support members 103 vertically downwards after the gripper 104 has been arranged below the object 105 until the gripper 104 engages the object 105. It is noted that in an embodiment the gripper used for removal of the object 105 may be a gripper which is different from the gripper 104 used for providing the object 105, e.g. both grippers may be arranged on opposite sides of the object 105, e.g. on the left and right side in FIG. 4a.

In the shown embodiment an encoder grating 106 is arranged above the object support 102 and the object 105. The encoder grating 106 is part of an encoder system for determining the position of the object support 102, which further comprises a plurality of encoder heads (not shown) arranged on the object support 102. The encoder system may be part of the position measurement system PMS. It is noted however that the invention can also be applied with different arrangements, e.g. an encoder grating being arranged on object support 102, the encoder grating co-operating with one or more sensors mounted above the object support 102, or different measurement systems, e.g. an interferometer system.

Figure 5A:
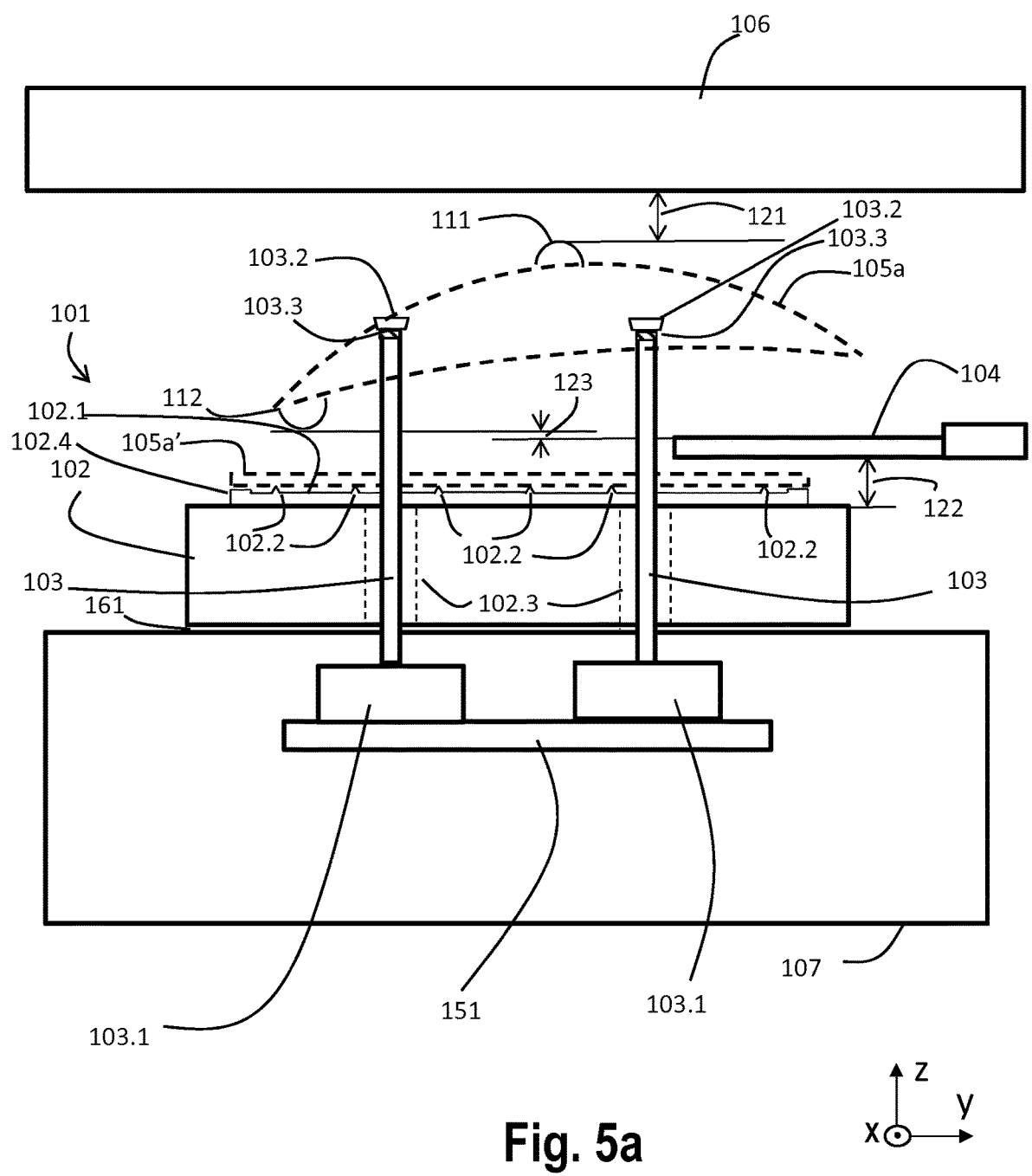
FIG. 5a illustrates the issues that may arise when the object supported by the stage apparatus has an out-of-plane shape.

Whereas traditionally objects such as substrates W were substantially flat, like the object 105 shown in FIG. 4a, recently more often substrates with out-of-plane shapes, e.g. warped or curved, are to be processed. FIG. 5a illustrates some issues that may arise when the object has an out-of-plane shape.

In FIG. 5a the support members 103 are arranged the same as in FIG. 4a, i.e. on the same height in the first direction z, but now they are supporting a warped object 105a. It is noted that FIG. 5a is a schematic illustration, since the two visible support members 103 are not arranged on the same level in the x-direction. The top of the support members 103 may in reality not be completely visible because the warped object 105a partially blocks the view.

Figure 5B:
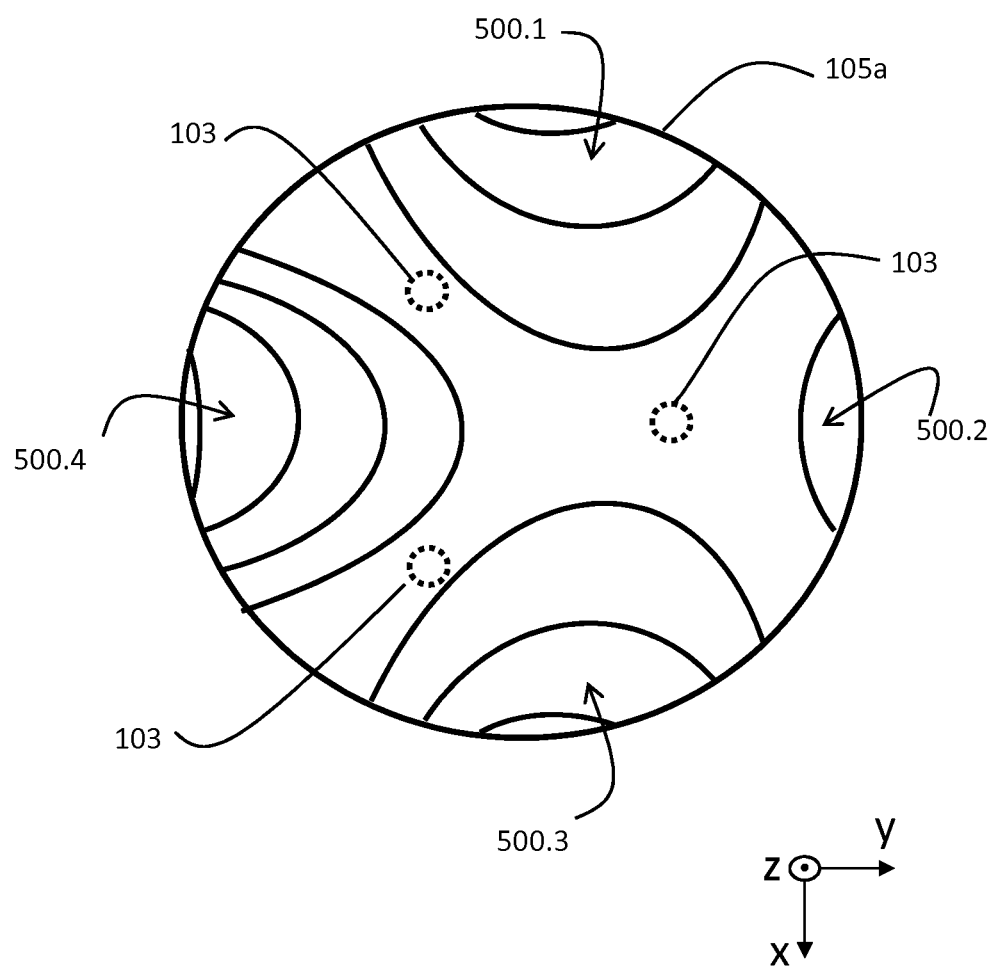

FIG. 5b shows a simplified top view illustrating the object 105a and the support members 103 wherein contour lines illustrate the height of the object 105a in the first direction z. In the shown example of the object 105a four out-of-plane areas 500.1, 500.2, 500.3, 500.4 can be identified. There is in particular a substantial difference between the out-of-plane area 500.2 on the right hand side in FIG. 5b, which has a limited height difference, and the out-of-plane area 500.4 on the left hand side in FIG. 5b, which has a substantial height difference. At said out-plane-area 500.4 on the left hand side the object 105a consumes more space in the first direction, as is also visible in FIG. 5a. Because of the warped shape of the object 105a, the object 105a covers more space in the first direction z than a flat object. In other words, a space consumption of the object 105a in the first direction z is larger for objects having an out-of-plane shape.

When the space consumption in the first direction z becomes too large there is risk of the object 105a coming into contact with encoder grating 106 or the gripper 104 which is undesired. The space consumption in the first direction z is even more critical when immersion lithography is applied, wherein at least a portion of the object 105a may be covered by a liquid having a relatively high refractive index, e.g., water. FIG. 5a illustrates a situation wherein a droplet 111 of water may be present on a highest point in the first direction z of the object 105a, and another droplet 112 may be present on a lowest point in the first direction z of the object 105a. A distance 121 in the first direction z between the droplet 111 and encoder grating 106 is very limited, as is a distance 123 in the first direction z between droplet 112 and the gripper 104. If the droplet 111 comes into contact with encoder grating 106 this may result in measurement errors, e.g. because a primary radiation beam and/or a secondary radiation beam of the encoder system are deflected by the droplet 111. If the droplet 112 comes into contact with the gripper 104, e.g. when the gripper 104 is moved horizontally to arrange the gripper 105 under the object 105a, this may result in wetting of subsequently incoming objects which may then e.g. stick to components of the handling system the gripper 104 is part of. It is noted that in an embodiment the gripper 104 may comprise gripper pads (not shown) for engaging with the object 105a when the gripper 104 is supporting the object 105a. Said gripper pads are preferably configured such that wetting of the gripper pads does not entail any problems. However, wetting of other parts of the gripper 104 may cause issues. It is further noted that it may not be feasible to arrange the encoder grating 106 higher, nor to arrange the gripper 104 lower, nor to design the gripper 104 to be thinner.

In addition, the support members 103 in the shown embodiment comprise optional suction pads 103.2 for providing a clamping force to clamp the object 105a. In the situation shown in FIG. 5a these suction pads 103.2 are not aligned with the surface of the object 105a which the suction pads 103.2 engage, which may result in leaks and as such prevent the suction pad 103.2 from providing the desired clamping force.

Figure 6A:
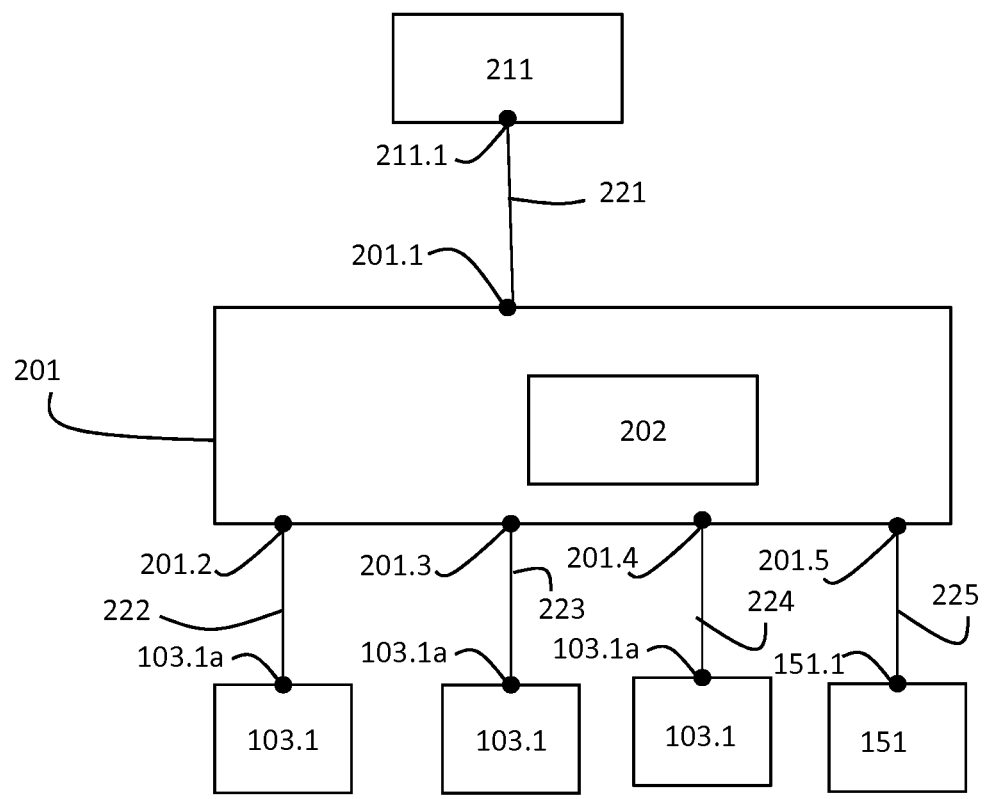
FIG. 6a schematically depicts the control unit of the stage apparatus according to the invention.

To mitigate these issues the stage apparatus 101 according to the invention comprises a control unit 201 which is schematically depicted in FIG. 6a. The control unit 201 comprises an input terminal 201.1 for receiving shape information 221 regarding an out-of-plane-shape of the object 105, and a processing unit 202. The processing unit 202 is configured to determine, based on said shape information 221, the positions of the support members relative to each other in at least the first direction. The control unit 201 is configured to control the positions of the support members 103 based on the shape information when the support members 103 are supporting the object 105.

Preferably the processing unit 202 of the control unit 201 is configured to determine the supporting arrangement such that the space consumption of the object 105 in the first direction z is substantially minimized.

The shape information represents at least the out-of-plane shape of the object. When the object is e.g. warped or curved the control unit 201 can determine this based on the shape information.

In the shown embodiment the stage apparatus 101 comprises three actuators 103.1, e.g. electric or piezoelectric actuators, of which two are visible in the side view shown in FIG. 4a and FIG. 5a. Each actuator 103.1 is configured to move one of the support members 103 individually in the first direction z. It is noted however that the stage apparatus 101 may comprises another number of actuators 103.1, which does not necessarily has to be equal to the number of support members 103. For example, one or more of the actuators 103.1 may be arranged to move two or more support members 103 simultaneously in the first direction z.

Referring now to FIG. 6a again, wherein it is shown that in an optional embodiment the control unit 201 comprises three output terminals 201.2, 201.3, 201.4 each for sending a control signal 222, 223, 224, respectively, to an input terminal 103.1a of the actuators 103.1. With said control signals 222, 223, 224 the control unit 201 can control the positions of the support members 103. It is noted that in an embodiment the output terminals of the control unit 201 may be comprised by a single output terminal.

Figure 6B:
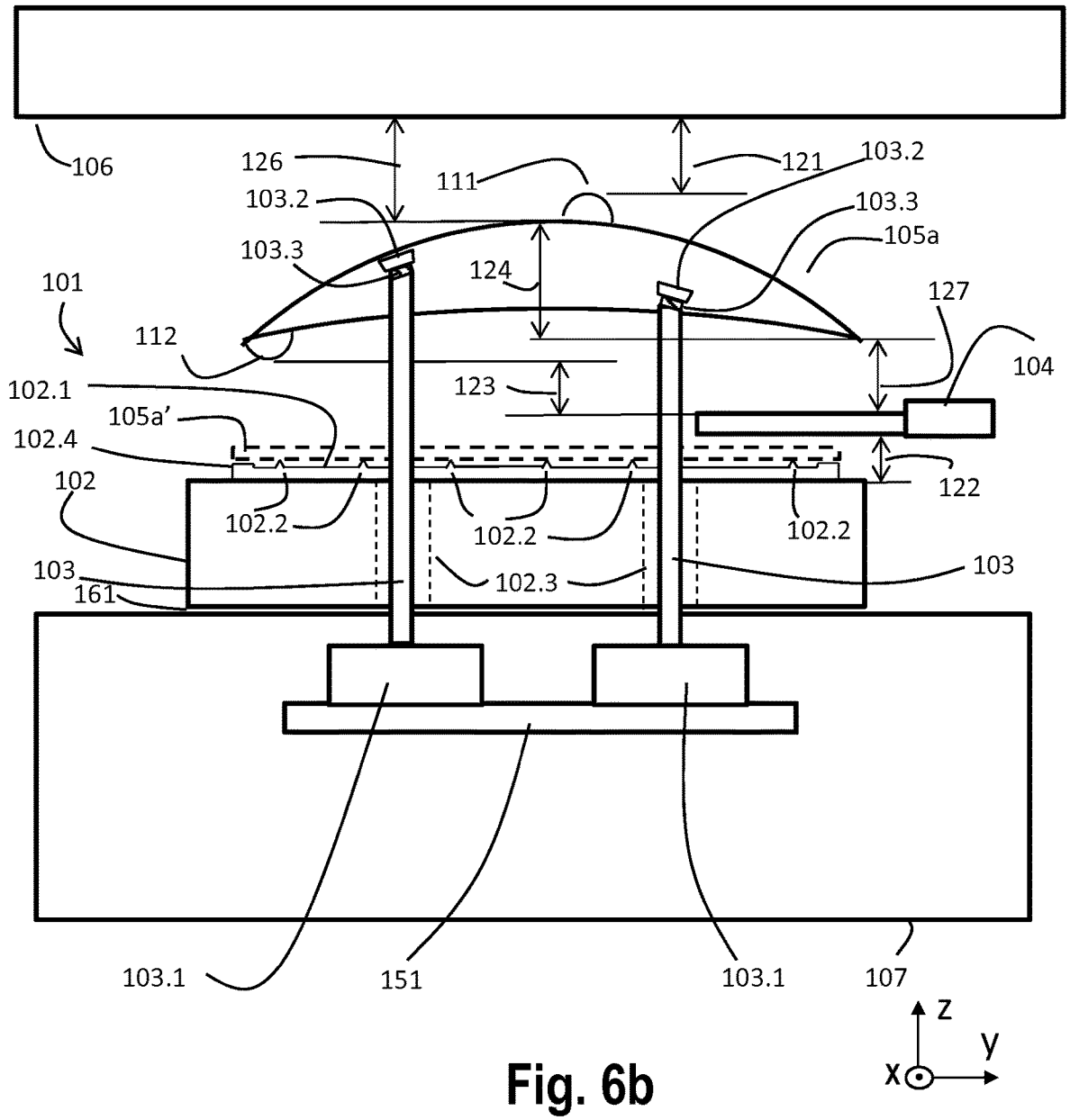
FIG. 6b depicts a side view of the stage apparatus according to the invention wherein the support members are arranged according to a supporting arrangement to support the warped object.

FIG. 6b shows a side view of the stage apparatus 101 according to the invention wherein the support members 103 are arranged so as to reduce the space consumption of the object 105a in the first direction z. As can be seen the two visible support members 103 are arranged on a different height in the first direction z. The space consumption of the object 105a in the first direction z is thereby minimized. In comparison to the situation shown in FIG. 5a the distances 121 and 123 are larger for the same object 105a. In other words the risk of the droplets 111, 112 coming into contact with other components has been reduced. It is noted that the invention may in particular be advantageous when the object is asymmetrical, e.g. saddle shaped. FIG. 6b shows distance 124 which indicates the distance between the lowest point and the highest point of the object 105a. The total distance between the encoder grating 106 and the upper part of the gripper 104 is equal to the sum of distances 124, 126 and 127. The control unit 201 is arranged to tilt the object 105 while the object 105 is supported by the support members 103. Based on the shape information, the control unit tilts the object 105 by controlling the positions of the support members 103 in the first direction z. As a result, the distance 124 is decreased, causing an increase in upper distance 126 and/or lower distance 127. By decreasing the distance 124, a space consumption of the object 105 in the first direction is reduced.

Figure 6C:
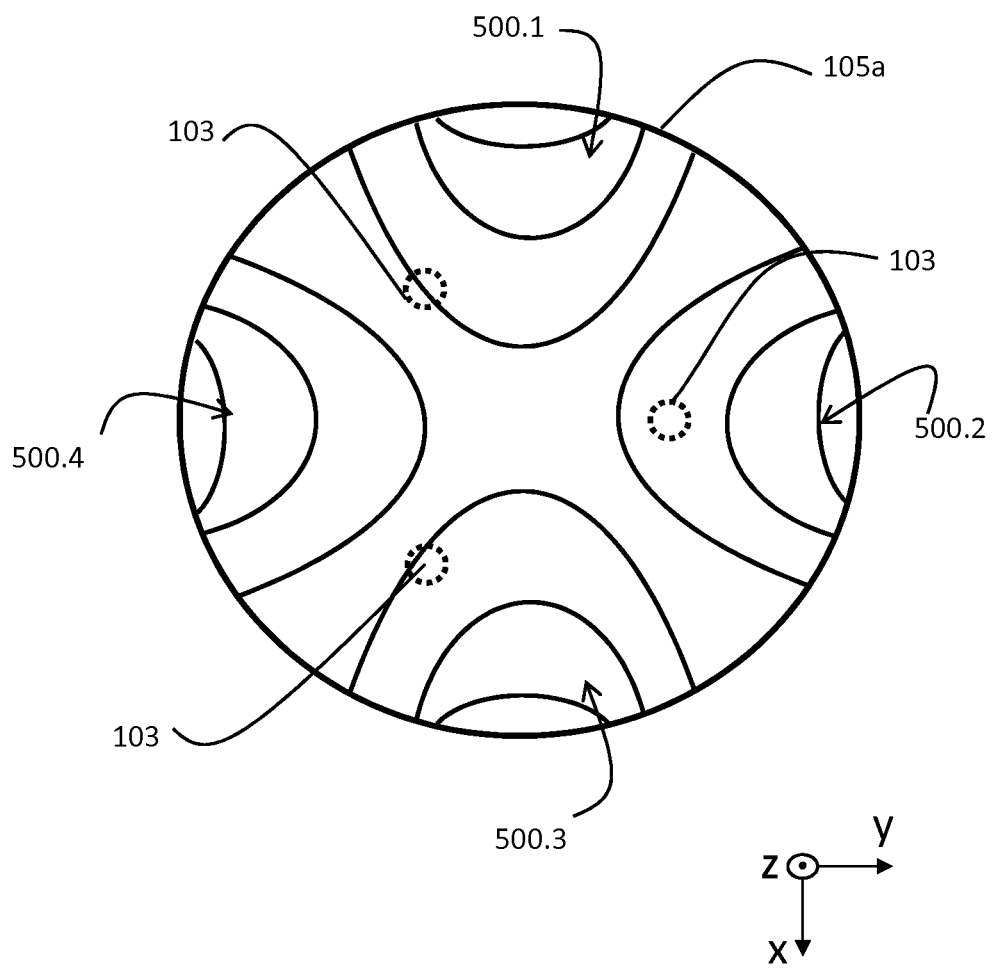
FIG. 6c illustrates a simplified top view of the warped object supported by the support members of the stage apparatus in the situation shown in FIG. 6b.

FIG. 6c illustrates a simplified top view of the warped object supported by the support members of the stage apparatus in the situation shown in FIG. 6b. Similarly to the top view depicted in FIG. 5b four out-of-plane areas 500.1, 500.2, 500.3, 500.4 can be identified. However now each of these out-of-plane areas 500.1, 500.2, 500.3, 500.4 have a similar height difference, as a result of the support members 103 being set at positions determined by the control unit 201. Furthermore, said height difference which is similar for each of the out-of-plane areas 500.1, 500.2, 500.3, 500.4 is smaller than the height difference of out-of-plane-area 500.4 in FIG. 5b. In other words, the space consumption in the first direction z of the object 105a has been reduced.

Referring FIGS. 6a and 6b, the stage apparatus 101 comprises the object support 102, a plurality of support members 103 and a control unit 201. The object support 102 comprises the surface 102.1 for mounting the object 105a on. The surface 102.1 extends in the xy-plane. The plurality of support members 103 support the object 105a. The plurality of support members 103 are further arranged to receive the object 105a from the gripper 104 and to arrange the object 105 on the surface 102.1 and/or vice versa. The support members 103 are movable in at least the first direction z which is perpendicular to the xy-plane. The control unit 201 is arranged to receive shape information regarding the out-of-plane-shape of the object 105a, and arranged to control the positions of the support members 103. The control unit 201 is arranged to tilt the object 105a while supported by the support members 103 by controlling the positions so as to reduce a space consumption of the object 105a in the first direction z, based on the shape information. The control unit 201 may tilt the object 105a in Rx, i.e., along the x-axis, in Ry, i.e., along the y-axis, or in a combination of Rx and Ry, i.e., along both the x-axis and y-axis.

The control unit 201 may be further arranged to determine a center of the object 105a during or after tilting the object 105a and to move the center to a desired position. The center is within the space consumption of the object 105a in the first direction z. By moving the center to a desired position, the control unit 201 may achieve that there is sufficient distance between the object 105a and the encoder grating 106, and between the object 105a and the gripper 104. The center of the object 105a may be halfway a most top part of the object 105a and a most bottom part of the object 105a along the first direction z. So the center may be from the encoder grating 106 at a distance of the sum of upper distance 126 and half the distance 124. The center may be from the gripper 104 at a distance of the sum of lower distance 127 and half the distance 124. Alternatively, the center of the object 105 may be at the centre point of the object 105. The control unit 201 may be arranged to determine the center of the object 105a during tilting, i.e., while changing the positions of the support members 103 relatively to each other in the first direction z. The control unit 201 may be arranged to determine the center of the object 105a after tilting, i.e., moving the support members 103 together in the first direction z after changing the positions of the support members 103 relatively to each other in the first direction z.

Referring now back to FIG. 6b, where is shown that the object 105a is supported by the supporting members 103 and the gripper 104 is below the object 105a. In an optional embodiment the control unit 201 is further configured to determine the positions of the supporting members 103 such that a lower distance 127 between the object 105a and the gripper 104 and an upper distance 126 between the object 105a and the encoder grating 106 are substantially equal. The control unit 201 is configured to control the positions of the supporting members 103 such that the lower distance 127 and the upper distance 126 are substantially equal to each other.

The upper distance 126 is measured in the first direction z between the point of the object 105a which is closest to the encoder grating 106, and the encoder grating 106. The lower distance 127 is measured in the first direction z between the point of the object 105a which is closest to the gripper 104, and the gripper 104. The upper distance 126 and lower distance 127 are in particular equal to each other when the gripper 104 is arranged to be moved parallel to the plane xy, which in FIG. 6b corresponds to the left or right. As such the risk of contact with one of the droplets 111, 112 or the object 105a itself and the gripper 104 or the encoder grating 106 is minimized.

In the described embodiments, instead of the encoder grating 106, there may be any other body. For example, the body is an encoder head.

In an optional embodiment the control unit 201 is configured to determine a local lower distance between the object 105a and the gripper 104 and/or a local upper distance 126 between the object 105a and the encoder grating 106 fulfil a predetermined requirement. Said predetermined requirement may e.g. entail a minimal value of the respective distance, or that the respective distance is to be substantially maximized. As such local optimization is possible, e.g. to prevent local contact or wetting of the gripper 104 and/or encoder grating 106, e.g. on parts of the gripper 104 and/or encoder grating 106 where the consequences of wetting are more severe or where the gripper 104 and/or encoder grating 106 are arranged closer to the object 105a.

In order to accurately project the pattern on the object 105a it is preferred that a top surface of object 105a is parallel to the surface 102.1 of the object support 102 after mounting the object 105a on the object support 102. The mounted position of the object 105a is illustrated in FIG. 6b by dashed lines 105a'. During the mounting of the object 105a and arranging it according to dashed lines 105a', additional stresses may occur in the object 105a, in particular when the object 105a has an out-of-plane shape. Said stresses that arise during the mounting of the object 105a may also be referred to as wafer load grid fingerprints, and are in conventional system rather unpredictable and unknown. Said stresses lead in deformations in the object 105a, resulting in inaccuracies in the projected pattern, which is undesirable.

In an embodiment of the stage apparatus 101, the control unit 201 is arranged to tilt the object 105 so as to reduce the space consumption of the object 105a in the first direction z by setting the support members 103 in a mounting arrangement in which the support members 103 have a relative position to each other in the first direction z. The control unit 201 is further configured to maintain the mounting arrangement while loading the object 103 on the surface 102.1.

The stress in the object 105a after mounting is dependent on how the object 105a is arranged on the surface 102.1 In this embodiment a mounting arrangement is determined based on which the positions of the support members 103 are controlled during mounting, thereby enabling to control the stress in the object 105a after mounting. Preferably an expected stress distribution in the object 105a after mounting is taken into account. For example, the mounting arrangement can be such that said stress distribution is minimized in amplitude, e.g., on certain locations of the object 105a or on average. It may also be advantageous to arrange the mounting arrangement such that said stress distribution is predictable. For example, the mounting arrangement may be such that the object 105a engages the surface 102.1 first on one side, e.g., left in FIG. 6b, followed by a gradual engagement towards the other side of the object 105a. The control unit 201 may be arranged to tilt the object 105a so as to reduce the space consumption of the object 105a in the first direction z by setting the support members 103 in the mounting arrangement in which the support members 103 have a relative position relative to each other in the first direction. The control unit 201 is configured to maintain the mounting arrangement while loading the object on the surface, i.e., while lowering the object 105a onto the surface 102.2.

In an embodiment the object support 102 comprises a vacuum clamping device to clamp the object 105a to the object support 102. Such a vacuum clamping device may e.g. comprise a plurality of vacuum sections or vacuum zones, e.g. distributed across the surface 102.1 of the object support 102, the vacuum sections or zones being arranged to provide a suction force for clamping the object 105a to the surface 102.1, in particular to the burls 102.2 of the surface 102.1. The vacuum sections or zones may also be referred to as suctions zones. In an embodiment, the processing unit may be configured to determine a suction force sequence based on the shape information, and the control unit is configured to control the vacuum sections or suction zones to provide the suction forces according to the suction force sequence during mounting of the object 105a on the surface 102.1. Optionally the control unit 201 is configured to determine the suction force sequence based on an expected stress distribution in the object 105 after mounting. Optionally the control unit 201 further is configured to determine the suction force suctions based on the mounting arrangement. More information on such a vacuum clamping device is given in WO2015/169616, which is incorporated herein by reference.

The suction forces are in general provided to clamp the object 105a such that the position of the object 105a is fixed when the pattern is projected on the object 105a. In addition when the object 105a has an out-of-plane shape, the suction forces essentially pull the object 105a towards the surface 102.1 such that the upper surface of the object 105a is parallel to the surface 102.1. Stresses occur in the object which are dependent on the sequence and magnitude of these suction forces. In this embodiment the control unit 201 can control both the sequence and magnitude of the suction forces and as such the stress distribution in the object 105a after mounting.

As is visible in FIGS. 4a, 5a, 6b, the stage apparatus 101 in the shown embodiment further comprises an optional common actuator 151, which is schematically shown in the figures, configured to move the plurality of support members 103 together in the first direction z. The common actuator 151 may e.g. arranged to make relatively large movements simultaneously with all support members 103. For example, the actuators 103.1 may be used to arrange the support members 103 according to the supporting arrangement and/or mounting arrangement, and the common actuator 151 may be used to move the object 105,105a upwards or downwards in the first direction z while the support members 103 are supporting the object 105,105a according to the supporting arrangement and/or mounting arrangement.

In an embodiment, as e.g. visible in FIG. 6a, the control unit 201 comprises an output terminal 201.5 for sending a control signal 225 to an input terminal 151.1 of the common actuator 151. As such the control unit 201 can control the position of the support members 103 in the first direction z.

In an embodiment, e.g. the embodiment shown in FIG. 6b, the support members 103 are arranged to be moveable in the first direction by increments of 10 μm or less, preferably 5 μm or less, more preferably 1 μm or less. Said increments may e.g. be accomplished by the actuators 103.1 and/or the common actuator 151.

In an embodiment the actuators 103.1 and/or the common actuator 151 are arranged to move the support members 103 in the first direction over a range of approximately 11 mm.

In an embodiment the support members 103 are arranged to clamp the object 105. For example, the support members 103 are arranged to provide a suction force to clamp the object 105. For example, in the shown embodiment the support members 103 comprise suction pads 103.2 to provide said suction force. Said suction pads may e.g. be connected to a pump (not shown) or a vacuum generator for providing the suction force.

In an embodiment the support members comprise a tilting section 103.3. The tilting section 103.3 is configured to tilt an upper part 103.2 of the support member 103 around an axis parallel to the plane, as is best visible in FIG. 6b wherein the tilting is depicted exaggerated for the sake of clarity. In the shown embodiment said upper part 103.2 corresponds with the suction pad 103.2. The tilting section 103.3 allows to improve the engagement between the support member 103 and the warped object 105a by aligning a top surface of the upper part 103.2 with the object 105a, e.g. by preventing leaks between the support member 103, e.g. the suction pad 103.2 of the support member 103, and the object 105. Said leaks could e.g. allow air to enter in between the suction pad 103.2 and the object 105, preventing the support member 103 from preventing the suction force to clamp the object 105. In an embodiment the tilting section 103.3 may comprise an elastomer material enabling tilting of the upper part 103.2 by partial compression of the elastomer material.

In an embodiment the stage apparatus 101 comprises a positioner for positioning the object support 102, wherein the positioner is of the embodiment comprising a short-stroke module and a long-stroke module 107. In this embodiment the short-stroke module comprises the object support 102 and the long-stroke module 107 comprises the plurality of support members 103. In the shown embodiment the object support 102 of the short-stroke module is spaced from the long-stroke module 107 by an air gap 161. Advantageously components such as the actuators 103.1, 151 are comprised by the long-stroke module. The short-stroke module, which needs to be positioned with high accuracy, does not contain said components, which could contribute to inaccuracies e.g. due to thermal energy released by such components. In addition no electrical and/or thermal leaks from the short-stroke module are created. Alternatively, the object support 102 comprises the plurality of support members 103.

In an embodiment the object support 102 comprises a plurality of holes 102.3 extending in the first direction z, wherein each of the support members 103 are configured to move in the first direction z through one of said holes 102.3. Preferably a diameter of said holes 102.3 is larger than a diameter of the support members 103, preferably the diameter of said holes 102.3 is large enough that the object support 102 can be moved over the movement range of the short-stroke module while the support members 103 are arranged in said holes 102.3 without contact between the support members 103 and the object support 102.

In an embodiment stage apparatus 101 may be arranged to accommodate objects of which the space compensation in the first direction is up to 550 μm when the support members 103 are in the supporting arrangement.

In an embodiment wherein the control unit is arranged to determine the mounting arrangement and/or the suction force sequence based on an expected stress distribution in the object, the control unit 201 may be configured to determine said expected stress distribution based on finite element models, optionally also using the shape information to make said finite element model.

It is noted that although in the shown example the out-of-plane shape of the object 105a is such that the object 105a has a concave shape when seen in side view, the invention can without modification be applied for different shapes of objects, including convex, e.g. if the object 105a would be arranged upside down.

The invention further relates to a lithographic apparatus LA as is for example shown in FIG. 1. The lithographic apparatus LA comprises a projection system PS for projecting a pattern onto a substrate W and the stage apparatus 101 according to the invention as e.g. shown in FIGS. 4a, 5a, and 6a-6b. The lithographic apparatus LA further comprises a gripper, e.g. the gripper 104, configured to arrange the object 105a above the object support 105, wherein the plurality of support members 103 are arranged to receive the object 102 from the gripper and arrange the object 105 on the surface 102.1 of the object support 102.

In an embodiment the object 105a which the support members 103 are arranged to support is the substrate W of the lithographic apparatus LA shown in FIG. 1 and the object support of the stage apparatus is the substrate support WT.

In an embodiment, e.g. shown in FIG. 2, the stage apparatus 101 may further comprise the base frame BF, and/or the balance mass BM, and/or the metrology frame MF, and/or the vibration isolation system IS.

The object 105 may be a semiconductor wafer. Alternatively, the object 105 may be a reticle or mask or any other type of substrate or object.

The stage apparatus 101 may be used in a lithographic apparatus. The stage apparatus 101 may alternatively be used in an inspection apparatus, for example an electron beam inspection apparatus arranged to inspect the object with an electron beam. The stage apparatus 101 may be used in an imprint apparatus arranged to imprint a structure on the object.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A stage apparatus, comprising:
   an object support comprising a surface configured to mount an object on, the surface extending in a plane;
   a plurality of support members configured to support the object and arranged to receive the object from a gripper and to arrange the object on the surface, wherein the support members are moveable in at least a first direction which is perpendicular to the plane; and
   a control unit arranged to receive shape information regarding an out-of-plane-shape of the object, and arranged to control positions of the support members, wherein the control unit is arranged to tilt the object while supported by the support members by controlling the positions so as to reduce a space consumption of the object in the first direction, based on the shape information,
   wherein the control unit is arranged to determine a center of the object during or after tilting the object and to move the center to a desired position, and
   wherein the center of the object is within the space consumption of the object in the first direction.

2. The stage apparatus of claim 1, wherein the center of the object is halfway from a top part of the object and a bottom part of the object along the first direction.

3. The stage apparatus of claim 1, wherein a body is arranged above the object, and
   wherein, when the object is supported by the supporting members and the gripper is below the object, the control unit is configured to control the positions such that a lower distance between the object and the gripper and an upper distance between the object and the body are substantially equal to each other.

4. The stage apparatus of claim 3, wherein the body is one of an encoder grating and an encoder head.

5. The stage apparatus of claim 1, comprising three support members.

6. The stage apparatus of claim 1, wherein the control unit is arranged to tilt the object so as to reduce the space consumption of the object in the first direction by setting the support members in a mounting arrangement in which the support members have a relative position relative to each other in the first direction, and
   wherein the control unit is configured to maintain the mounting arrangement while loading the object on the surface.

7. The stage apparatus of claim 6, wherein the object support comprises a plurality of suction zones arranged to provide a suction force for clamping the object to the surface, wherein the control unit is configured to determine a suction force sequence based on the shape information, and wherein the control unit is configured to control the suction zones to provide the suction forces according to the suction force sequence during mounting of the object on the surface.

8. The stage apparatus of claim 6, wherein the control unit further is configured to determine the suction force suctions based on the mounting arrangement.

9. The stage apparatus of claim 1, further comprising a positioner comprising a short-stroke module and a long-stroke module, wherein the short-stroke module comprises the object support and the long-stroke module comprises the plurality of support members.

10. The stage apparatus of claim 1, wherein at least one of the support members comprises a tilting section configured to tilt an upper part of the at least one support member around an axis parallel to the plane.

11. The stage apparatus of claim 1, further comprising a common actuator configured to move the plurality of support members simultaneously in the first direction.

12. A lithographic apparatus comprising:
a projection system for projecting a pattern onto a substrate;
the stage apparatus of claim 1; and
a gripper configured to arrange the object above the object support, wherein the plurality of support members are arranged to receive the object from the gripper and arrange the object on the surface of the object support,
wherein the control unit is arranged to determine a center of the object during or after tilting the object and to move the center to a desired position, and
wherein the center of the object is within the space consumption of the object in the first direction.

13. The lithographic apparatus of claim 12, wherein the center of the object is halfway from a top part of the object and a bottom part of the object along the first direction.

14. The lithographic apparatus of claim 12, wherein a body is arranged above the object, and
wherein, when the object is supported by the supporting members and the gripper is below the object, the control unit is configured to control the positions such that a lower distance between the object and the gripper and an upper distance between the object and the body are substantially equal to each other.

15. The lithographic apparatus of claim 12, wherein the control unit is arranged to tilt the object so as to reduce the space consumption of the object in the first direction by setting the support members in a mounting arrangement in which the support members have a relative position relative to each other in the first direction, and
wherein the control unit is configured to maintain the mounting arrangement while loading the object on the surface.

16. The lithographic apparatus of claim 12, further comprising a positioner comprising a short-stroke module and a long-stroke module, wherein the short-stroke module comprises the object support and the long-stroke module comprises the plurality of support members.

17. A lithographic apparatus comprising:
a projection system for projecting a pattern onto a substrate;
the stage apparatus of claim 1; and
a gripper configured to arrange the object above the object support, wherein the plurality of support members are arranged to receive the object from the gripper and arrange the object on the surface of the object support,
wherein the control unit is arranged to determine a center of the object during or after tilting the object and to move the center to a desired position,
wherein a body is arranged above the object, and
wherein, when the object is supported by the supporting members and the gripper is below the object, the control unit is configured to control the positions such that a lower distance between the object and the gripper and an upper distance between the object and the body are substantially equal to each other.

18. A lithographic apparatus comprising:
a projection system for projecting a pattern onto a substrate;
the stage apparatus of claim 1; and
a gripper configured to arrange the object above the object support, wherein the plurality of support members are arranged to receive the object from the gripper and arrange the object on the surface of the object support,
wherein the control unit is arranged to determine a center of the object during or after tilting the object and to move the center to a desired position, and
wherein at least one of the support members comprises a tilting section configured to tilt an upper part of the at least one support member around an axis parallel to the plane.

19. A stage apparatus, comprising:
an object support comprising a surface configured to mount an object on, the surface extending in a plane;
a plurality of support members configured to support the object and arranged to receive the object from a gripper and to arrange the object on the surface, wherein the support members are moveable in at least a first direction which is perpendicular to the plane; and
a control unit arranged to receive shape information regarding an out-of-plane-shape of the object, and arranged to control positions of the support members, wherein the control unit is arranged to tilt the object while supported by the support members by controlling the positions so as to reduce a space consumption of the object in the first direction, based on the shape information,
wherein a body is arranged above the object, and
wherein, when the object is supported by the supporting members and the gripper is below the object, the control unit is configured to control the positions such that a lower distance between the object and the gripper and an upper distance between the object and the body are substantially equal to each other.

20. A stage apparatus, comprising:
an object support comprising a surface configured to mount an object on, the surface extending in a plane;
a plurality of support members configured to support the object and arranged to receive the object from a gripper and to arrange the object on the surface, wherein the support members are moveable in at least a first direction which is perpendicular to the plane; and
a control unit arranged to receive shape information regarding an out-of-plane-shape of the object, and arranged to control positions of the support members, wherein the control unit is arranged to tilt the object while supported by the support members by controlling the positions so as to reduce a space consumption of the object in the first direction, based on the shape information,
wherein at least one of the support members comprises a tilting section configured to tilt an upper part of the at least one support member around an axis parallel to the plane.

* * * * *